United States Patent [19]
Ahmad et al.

[11] Patent Number: 5,790,384
[45] Date of Patent: Aug. 4, 1998

[54] BARE DIE MULTIPLE DIES FOR DIRECT ATTACH

[75] Inventors: Umar M. Ahmad, Hopewell Junction, N.Y.; Eugene R. Atwood, Housatonic, Mass.

[73] Assignee: International Business Machines Corporation, Armonk, N.Y.

[21] Appl. No.: 883,112

[22] Filed: Jun. 26, 1997

[51] Int. Cl.$^6$ .......................... H05K 01/00; H01L 25/00
[52] U.S. Cl. .................. 361/760; 361/762; 361/764; 361/765; 361/767; 361/772; 361/777; 361/779; 361/784; 361/790; 257/777; 257/778; 257/780; 257/781; 257/782; 257/784; 257/737; 257/738
[58] Field of Search ...................... 361/760, 762, 361/764, 765, 767, 772, 777, 779, 784, 785, 790; 257/777, 778, 780, 781, 782, 783, 784, 785, 788, 737, 738

[56] References Cited

U.S. PATENT DOCUMENTS

| | | | |
|---|---|---|---|
| 5,222,014 | 6/1993 | Lin | 361/792 |
| 5,285,352 | 2/1994 | Pastore et al. | 361/707 |
| 5,311,059 | 5/1994 | Banerji et al. | 257/778 |
| 5,347,162 | 9/1994 | Pasch | 257/773 |
| 5,422,435 | 6/1995 | Takiar et al. | 174/52.4 |
| 5,454,160 | 10/1995 | Nickel | 29/840 |
| 5,473,814 | 12/1995 | White | 29/840 |
| 5,477,082 | 12/1995 | Buckley, III et al. | 257/679 |
| 5,495,398 | 2/1996 | Takiar et al. | 361/790 |
| 5,502,289 | 3/1996 | Takiar et al. | 174/266 |
| 5,535,101 | 7/1996 | Miles et al. | 367/808 |
| 5,535,526 | 7/1996 | White | 34/78 |
| 5,563,446 | 10/1996 | Chia et al. | 257/704 |
| 5,569,963 | 10/1996 | Rostoker et al. | 257/773 |
| 5,570,274 | 10/1996 | Saito et al. | 361/784 |
| 5,579,207 | 11/1996 | Hayden et al. | 361/790 |
| 5,608,262 | 3/1997 | Degani et al. | 257/723 |
| 5,615,089 | 3/1997 | Yoneda et al. | 361/764 |
| 5,642,262 | 6/1997 | Terrill et al. | 361/783 |

*Primary Examiner*—Leo P. Picard
*Assistant Examiner*—David Foster
*Attorney, Agent, or Firm*—Ratner & Prestia; Tiffany L. Townsend, Esq.

[57] ABSTRACT

A chip package includes a substrate formed from a first die and its attendant wiring interconnections, having a first thermal coefficient of expansion. The first die includes primary input/output (I/O) interconnections for the chip package. Also provided is a second die that includes escape wiring formed on that die and coupled to the primary I/O interconnections through the first die. The second die has a second thermal coefficient of expansion similar to the first thermal coefficient of expansion. The chip package also includes connectors that couple the primary I/O interconnections of the first die to a second level package. An interposer may be provided to couple the primary I/O interconnections to the second level package. The second die is smaller than the first die. The peripheral area of the first die is left exposed when the second die is coupled to the first die so that sufficient I/O interconnections may be formed for the primary I/O interconnections on the first die. The second die provides and receives signals which may include the second die's primary I/O to and from the first die. Wiring may be shared between the first die and the second die in a manner optimal for design and manufacturing.

28 Claims, 7 Drawing Sheets

BARE DIE MULTIPLE DIES FOR DIRECT ATTACH

FIELD OF THE INVENTION

This invention relates to semiconductor devices in general and, more specifically, to coupling multiple dies together to form a chip package.

BACKGROUND OF THE INVENTION

There is an increased demand to provide faster access to a large amount of memory for microprocessors. Typically, a microprocessor system includes level one and level two cache controllers. The cache controllers are used to control access to the memory coupled to the microprocessor. A level one cache controller controls access to a level one cache memory that is located on the microprocessor chip. Access to the level one cache memory is typically performed at the same clock rate as the clock rate of the microprocessor. A level two cache controller controls access to the level two cache memory. The level two cache memory is not located on the microprocessor chip. Access to the level two cache memory is typically performed at a lower clock rate than the clock rate of the microprocessor chip. Further, access to the level two cache memory must be coordinated with access to the level one cache memory. As a result, access to the level two cache memory reduces the performance of the microprocessor chip as compared with a level one cache.

To overcome this problem, memory has been closely coupled to the microprocessor to reduce access time to the memory. One process of coupling a microprocessor and memory uses a second level of packaging. In this process, a microprocessor chip and a memory chip are packaged separately in the first level packages and subsequently combined together on a printed circuit board to form a second level package. The second level package adds cost, however, to the final product. Further, the second level packaging causes undesirable loading effects.

Another approach is to use a multi-chip module. This approach reduces network delays but often is a more costly process because of the unique package.

Alternatively, memory may be fabricated on the same die with the microprocessor. In this case, the overall silicon yield may be low due to (1) the mixing of processes that are used to form the memory and the microprocessor, and (2) the large number of circuits that are formed in the combined circuit. As a result, the type and amount of memory that may be fabricated on the die with the microprocessor is limited.

Typically, the memory provided on the same die with the microprocessor is a static random access memory (SRAM). Five or six transistor gates are needed to produce the memory cells of the SRAM. Further, the large quantity of memory cells will tend to not have a high yield in toto and the resulting die may be very large. As a result, there is an increased likelihood that a defect will occur because the probability of producing a faultless die decreases exponentially as a function of increasing area of the die. To compensate for these problems, redundant circuitry, additional byte lines, and memory cells are incorporated into the die, increasing the cost of the die well above that of individual dies.

Thus, it is an object of the present invention to provide fast access to a large amount of memory for microprocessors and other circuitry. It is a further object reduce the size of the microprocessor die. It is also an object of the present invention to provide a reliable chip package with the above features.

SUMMARY OF THE INVENTION

To achieve these and other objects, and in view of its purposes, the present invention provides a chip package. The chip package includes a substrate formed from a first die and its attendant wiring interconnections, having a first thermal coefficient of expansion. The first die includes primary input/output (I/O) interconnections for the chip package. Also provided is a second die that includes escape wiring formed on that die and coupled to the primary I/O interconnections through the first die. The second die has a second thermal coefficient of expansion similar to the first thermal coefficient of expansion. The chip package also includes connectors that couple the primary I/O interconnections of the first die to a second level package. An interposer may be provided to couple the primary I/O interconnections to the second level package. The second die is smaller than the first die. One or more dies may be provided and coupled to the first die. The additional dies have a thermal coefficient of expansion that is substantially the same as the first thermal coefficient of expansion. The peripheral area of the first die is left exposed when the second die and/or additional dies are coupled in a similar manner to the first die so that sufficient I/O interconnections may be formed for the primary I/O interconnections on the first die. The second die provides and receives signals which may include the second die's primary I/O to and from the first die. The first die further includes a first active surface and the second die includes a second active surface where the first active surface faces the second active surface. An area array connector is formed between the first active surface and the second active surface thereby forming the complete network needed for functionality. Wiring may be shared between the first die and the second die in a manner optimal for design and manufacturing.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
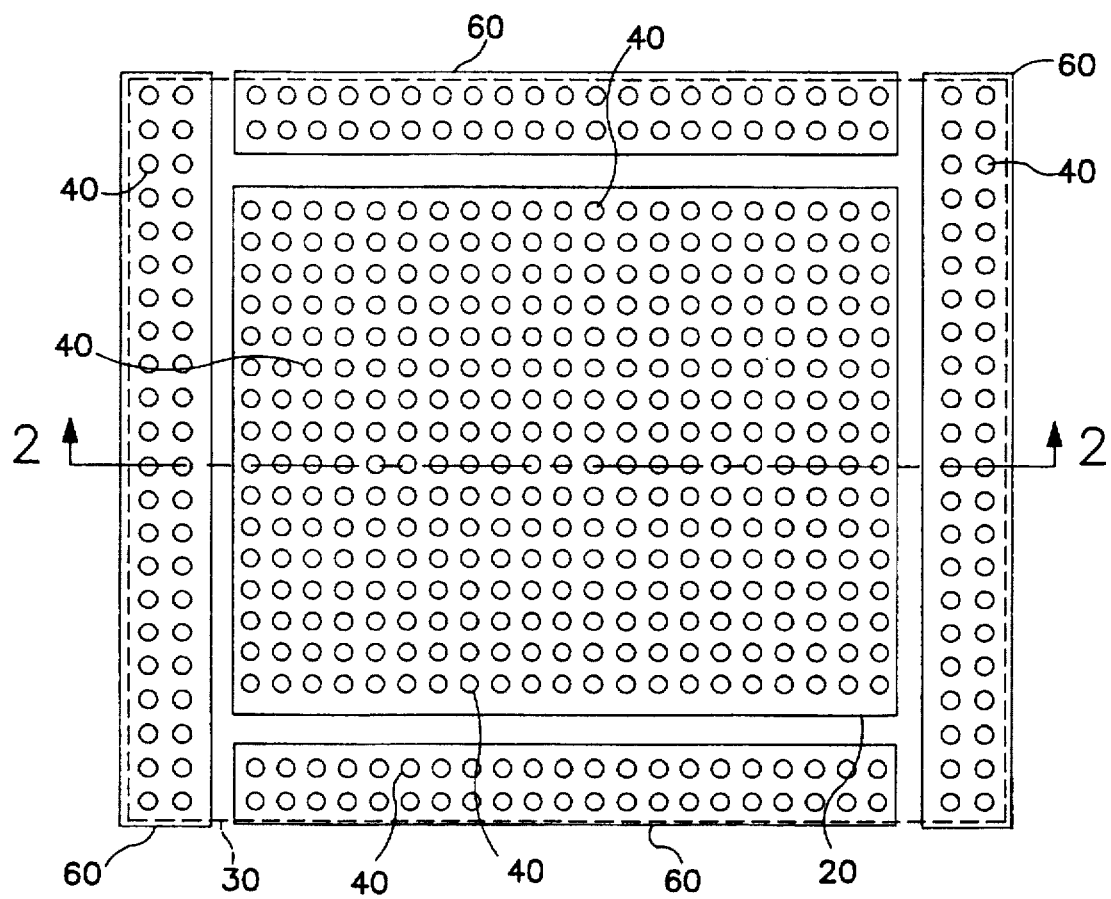
FIG. 1 is a top view of the chip package according to an exemplary embodiment of the present invention.
Figure 2:
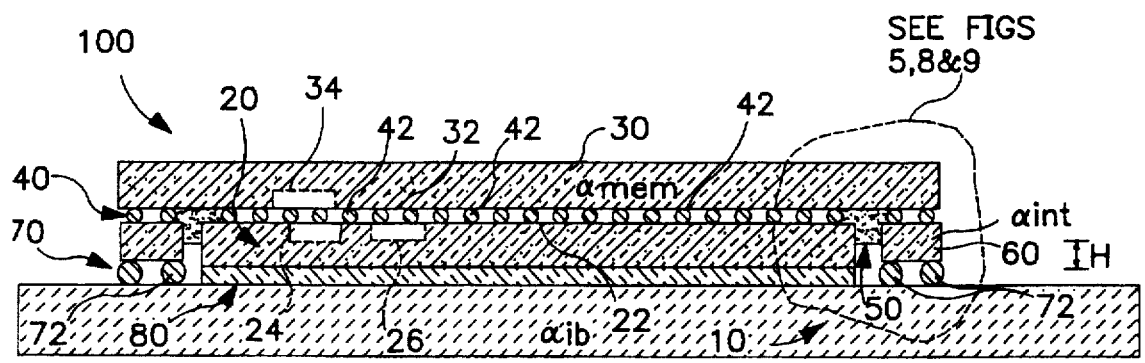
FIG. 2 is a cross sectional view along line 2—2 of the chip package shown in FIG. 1.

Referring now to the drawing, wherein like reference numerals refer to like elements throughout, FIGS. 1 and 2 illustrate a first exemplary embodiment of a chip package 100. FIG. 1 is a top view of the chip package 100 and FIG. 2 is a cross sectional view along line 2—2 of the chip package 100.

The chip package 100 includes a memory die 30 coupled to a microprocessor die 20 using a direct die attach process. Alternatively, the microprocessor die 20 and the memory die 30 may be swapped so that the microprocessor die 20 is on top of the memory die 30. The memory die 30 and the microprocessor 20 each have an active face 32 and 22, respectively. The active faces 32 and 22 are surfaces on the memory die 30 and the microprocessor die 20 where electrical connections are created with the circuitry formed on the respective dies.

The microprocessor die 20 and the memory die 30 are electrically connected using a ball grid array (BGA) 40 such as C4 connectors or other area array connectors between the active faces 32 and 22. The pitch size of the connectors 42 in the BGA 40 are, for example, between 0.000254 m (10 mils) to 0.000762 m (30 mils). The connectors 42 formed between the memory die 30 and the microprocessor die 20 may be an even finer pitch micro grid array having a pitch of approximately 0.000127 m (5 mils).

The BGA 40 forms a very short path length connection between the memory die 30 and the microprocessor die 20. As a result, the "Harvard" architecture of the microprocessor die 20 may be added, extended, or removed to the memory die 30. In the Harvard architecture, access to the cache memory is provided via a bus that is separate from the bus for the main memory. In this case, additional control circuitry may be expanded in the Harvard architecture to compensate for the larger memory. For example, additional address lines may be added to access the larger memory. Thus, the level two cache controller may be eliminated from the microprocessor die 20 or system design because the level two cache memory control and the level one cache memory control may be integrated as one between the microprocessor die 20 and the memory die 30. Further, the memory may be removed from the microprocessor die 20. As a result, the size of the microprocessor die 20 may be reduced. Further, the close proximity of the memory die 30 to the microprocessor die 20 enables the memory die 30 to be operated at the same clock rate as if the memory were located on the microprocessor die 20.

The size of the connectors 42 are selected to accommodate the interconnections between the microprocessor die 20 and the memory die 20 and interconnections from the microprocessor die 30 and an interconnection substrate 10. The interconnection substrate 10 is, for example, a printed circuit board.

The BGA 40 formed between the microprocessor die 20 and the memory die 30 allows the microprocessor die 20 to access the memory die 30 for the retrieval and storage of data. For example, the first circuit 24 of the microprocessor die 20 and the third circuit 34 of the memory die 30 are electrically coupled through the BGA 40 for the transmission of signals between the first circuit 24 and the third circuit 34.

The BGA 40 also provides access to escape wiring, the primary I/O, for the microprocessor die 20 and the memory die 30 to the interconnection substrate 10. The escape wiring provides external connections for the microprocessor die 20 and the memory die 30 to and from the interconnection substrate 10. The escape wiring for the microprocessor die 20 and the memory die 30 form the primary I/O interconnections for the chip package 100. Accordingly, the memory die 30 includes escape wiring (not shown) formed on the die for routing the external interconnections of the microprocessor die 20 to the interconnection substrate 10. The escape wiring may be formed when the circuitry of the memory die 30 is fabricated. In this way, the escape wiring is integrated with the other circuitry that is formed on the memory die 30. Similarly, the escape wiring may be formed on another die such as the microprocessor die 20, either all, partly, or jointly in an optimal arrangement. For example, wiring for the microprocessor die 20 may be fabricated on the memory die 30 thereby reducing the wiring congestion on the microprocessor die 20. For example, the wiring interconnecting the first circuit 24 and the second circuit 26 of the microprocessor die 20 may be formed in part on the memory die 30.

The microprocessor die 20 and the memory die 30 are held together by a die potting compound 50 formed between the microprocessor die 20 and the memory die 30. The die potting compound 50 mechanically and thermally stabilizes the memory die 30 and the microprocessor die 20. This increases the fatigue lifetime of the chip package 100.

The microprocessor die 20 and the memory die 30 are selected so that one of these dies is larger than the other die. As is shown in FIG. 2, the larger die, the memory die 30, extends beyond the microprocessor die 20 so that interconnections may be formed between the memory die 30 and the interconnection substrate 10 via the interposers 60. The larger die, the memory die 30, has a robust power distribution system and a plurality of power distribution interconnections to the microprocessor die 20 via the BGA 40 so as not to impede the supply of power to the microprocessor die 20. Bus transceivers and/or latches (not shown) may be formed along the periphery of the larger die, the memory die 30, to avoid internal power supply current surges from circuitry formed on the memory die 30 and the microprocessor die 20. Alternatively, the microprocessor die 20 may be fabricated as the larger die.

The thermal coefficient of expansion of the memory die 30 is $\alpha_{mem}$. The thermal coefficient of expansion of the microprocessor die 20 is $\alpha_{mic}$. The microprocessor die 20 and the memory die 30 are fabricated from materials that have the same or substantially the same coefficients of thermal expansion ($\alpha_{mem} \approx \alpha_{mic}$). For example, the microprocessor die 20 and the memory die 30 may be fabricated from silicon joined together with the BGA 40, such as a micro BGA, and potted. In this way, due to the intimate thermal contact, the microprocessor die 20 and the memory die 30 will expand or contract at similar rates during heating and cooling of the chip package 100. As a result, the fatigue life of the BGA 40 between the memory die 30 and the microprocessor die 20 is improved.

The thermal coefficient of expansion of the interposers 60 is $\alpha_{int}$. The interposers 60 may also be fabricated from a material that has the same or substantially the same thermal coefficient of expansion as the microprocessor die 20 and the memory die 30 ($\alpha_{mem} \approx \alpha_{mic} \approx \alpha_{int}$). For example, the interposers 60 may be fabricated from silicon. Alternatively, the material for the interposers 60 may be selected so that the thermal coefficient of expansion $\alpha_{int}$ of the interposers 60 may be between the thermal coefficient of expansions $\alpha_{mem}$ and $\alpha_{mic}$ and the thermal coefficient of expansion $\alpha_{ib}$ of the interconnection substrate or board 10 ($\alpha_{mem} < \alpha_{int} < \alpha_{ib}$).

Alternatively, the material of the interposers 60 may be selected and fabricated to have a graded thermal coefficient of expansion. In other words, different segments of the interposers 60 expand at different rates. The graded thermal coefficient of expansion accounts for differences in the rates of expansion between the interconnection substrate 10 and the microprocessor die 20 and the memory die 30. Further, the height H of the interposers 60 may be increased to reduce the impact of differences between the rates of expansion between the interconnection substrate 10 and the chip package 100.

The strain exerted on the interposers 60 during expansion or contraction of the chip package 100 and the interconnection substrate 10 is averaged over the height of the interposers 60. Thus, as the height of the interposers 60 are increased, the average force exerted decreases. As a result, strain exerted on the BGA 40 is reduced. The interposers 60 also provide structural support for decoupling capacitance either attached to or fabricated directly as part of the interposers 60. The decoupling capacitance may be coupled between the memory die 30 and the interposers 60. Alternately, the decoupling capacitance may be formed on the memory die 30.

Formed between the microprocessor die 20 and the interconnection substrate 10 is a thermal material 80. The thermal material 80 allows the microprocessor die 20 and the memory die 30 to be coupled to the thermal environment of the interconnection substrate 10. Alternatively, an open space may be formed between the microprocessor die 30 and the interconnection substrate 10.

The memory die 30 is also coupled to the interposers 60 via the BGA 40. The interposers 60 are coupled to the interconnection substrate 10 via the BGA 70. The interposers 60 fan out the escape wiring from the memory die 40 from the BGA 40 to the BGA 70. For example, the centers of connectors 42 may be spaced 0.000127 m (5 mils) apart while the centers of interconnections 72 may be spaced 0.00127 m (50 mils) apart. Alternatively, the centers of connectors 42 may be spaced 0.0001016 m (4 mils) apart while the centers of interconnections 72 may be spaced 0.00254 m (100 mils) apart. In other words, the space between signal lines is increased as the signal lines pass through the interposers 60. The connectors 42 may also be formed at about a 1 mm or 1.27 mm pitch.

The interposers 60 may be formed as a continuous ring or in segments as shown in FIG. 1. The interposers 60 provide the electrical interconnections from the microprocessor die 20 and the memory die 30 to the interconnection substrate 10. In an alternative embodiment, a heat sink may also be coupled to the memory die 30 or the microprocessor die 20.

Production yields of the memory die 30 and the microprocessor die 20 may be increased using the chip package 100. Separate processes to produce the memory die 30 and the microprocessor die may be implemented separately to maximize the yield of those individual die types. In this way, the fabrication processes for the memory die 30 and the microprocessor die 20 do not have to be mixed.

Further, the chip package 100 may be suitable for systems that allow a lower total number of input and outputs (I/O) implemented using peripheral or windowed I/O arrays. This number may be, for example, the total number of signal lines for a PCI bus, a local video bus, and a power bus. This is, for example, three hundred signal lines.

Figure 3:
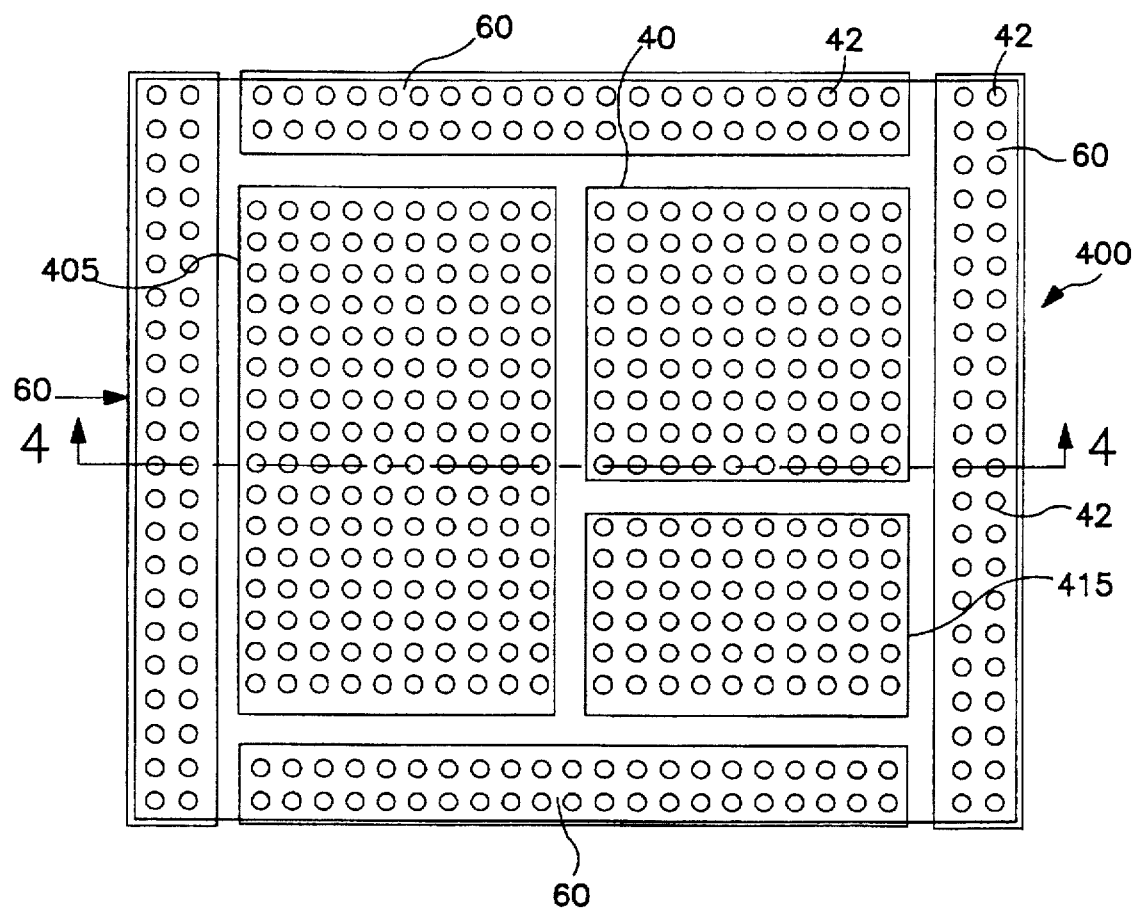
FIG. 3 is a top view of the chip package according to another exemplary embodiment of the present invention.
Figure 4:
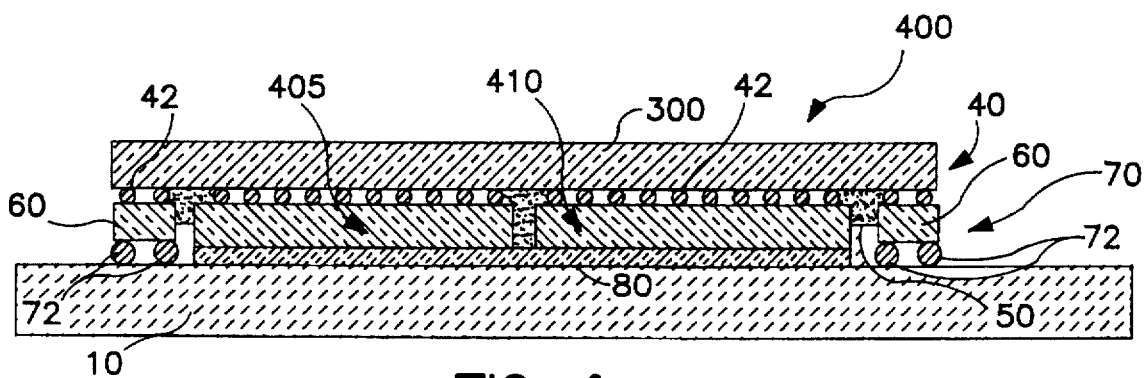
FIG. 4 is a cross sectional view along line 4—4 of the chip package shown in FIG. 3.

FIG. 3 and 4 illustrate another chip package 400 according to an exemplary of the present invention. FIG. 3 is a top view of the chip package 400 and FIG. 4 is a cross sectional view along line 4—4 of the chip package 400. The embodiment shown in FIGS. 3 and 4 is the same as that the embodiment shown in FIGS. 1 and 2 except the microprocessor die 20 has been replaced with three separate dies 405, 410, and 415. Alternatively, more or less than three dies may be included in the chip package 400. Further, there may be two or more dies coupled to the memory die 300. The memory die 300 is the same as memory die 30, shown in FIGS. 1 and 2, except that memory die 300 is coupled to more than one other die.

For example, dies 405, 410, and 415 may respectively be a microprocessor die, a modem die, and a decoder die. Each die may be interconnected via the memory die 300. The memory die 300 also provides the escape wiring for the dies 405, 410, and 415 to the interposers 60 as described above.

Figure 6:
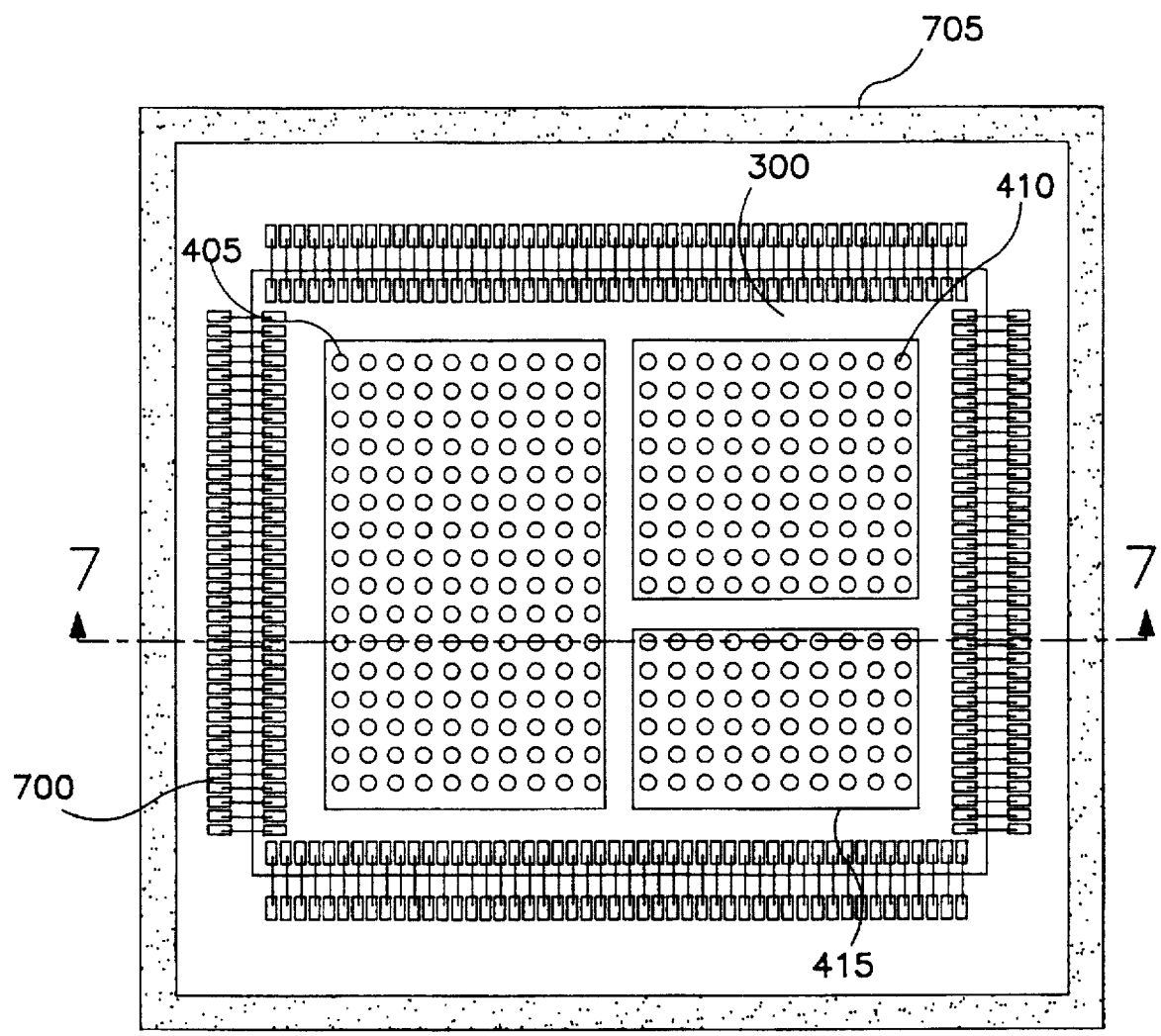
FIG. 6 is a top view of the chip package according to a further exemplary embodiment of the present invention.
Figure 7:
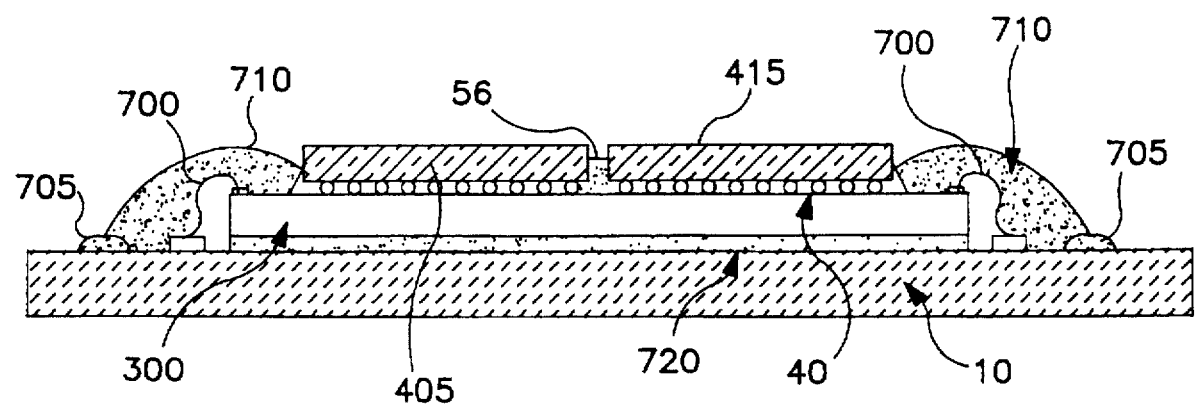
FIG. 7 is a cross sectional view along line 7—7 of the chip package shown in FIG. 6.

FIGS. 6 and 7 illustrate another chip package 750 according to another exemplary embodiment of the present invention. FIG. 6 is a top view of the chip package 750 and FIG. 7 is a cross sectional view along line 7—7 of the chip package 750. The embodiment shown in FIGS. 6 and 7 is the same as that the embodiment shown in FIGS. 3 and 4 except the interposers 60, shown in FIGS. 3 and 4, have been eliminated and the chip package 750 is wire bonded to the interconnection substrate 10.

The memory die 300 is coupled to the interconnection substrate 10 using a package or die adhesive 720. Wire bonds 700 are formed between the memory die 300 and the interconnection substrate 10. A potting compound dam 705 is formed around the wire bonds 700 and the interconnection substrate 10. Although the potting compound dam 705 is shown having a rectangular shape, it may have a circular or some other shape. When potting compound 710 is applied to the chip package 750, the potting compound dam 705 prevents the potting compound 710 from flowing to other locations on the interconnection substrate 10. The potting compound 710 may cover all or part of the memory die 300 and the dies 405, 410, and 415 and not just the wire bonds 700. A potting compound 710 may also be formed on the chip package 100 shown in FIGS. 1 and 2. In this case, the interposers 60 serve as a potting compound dam.

Figure 8:
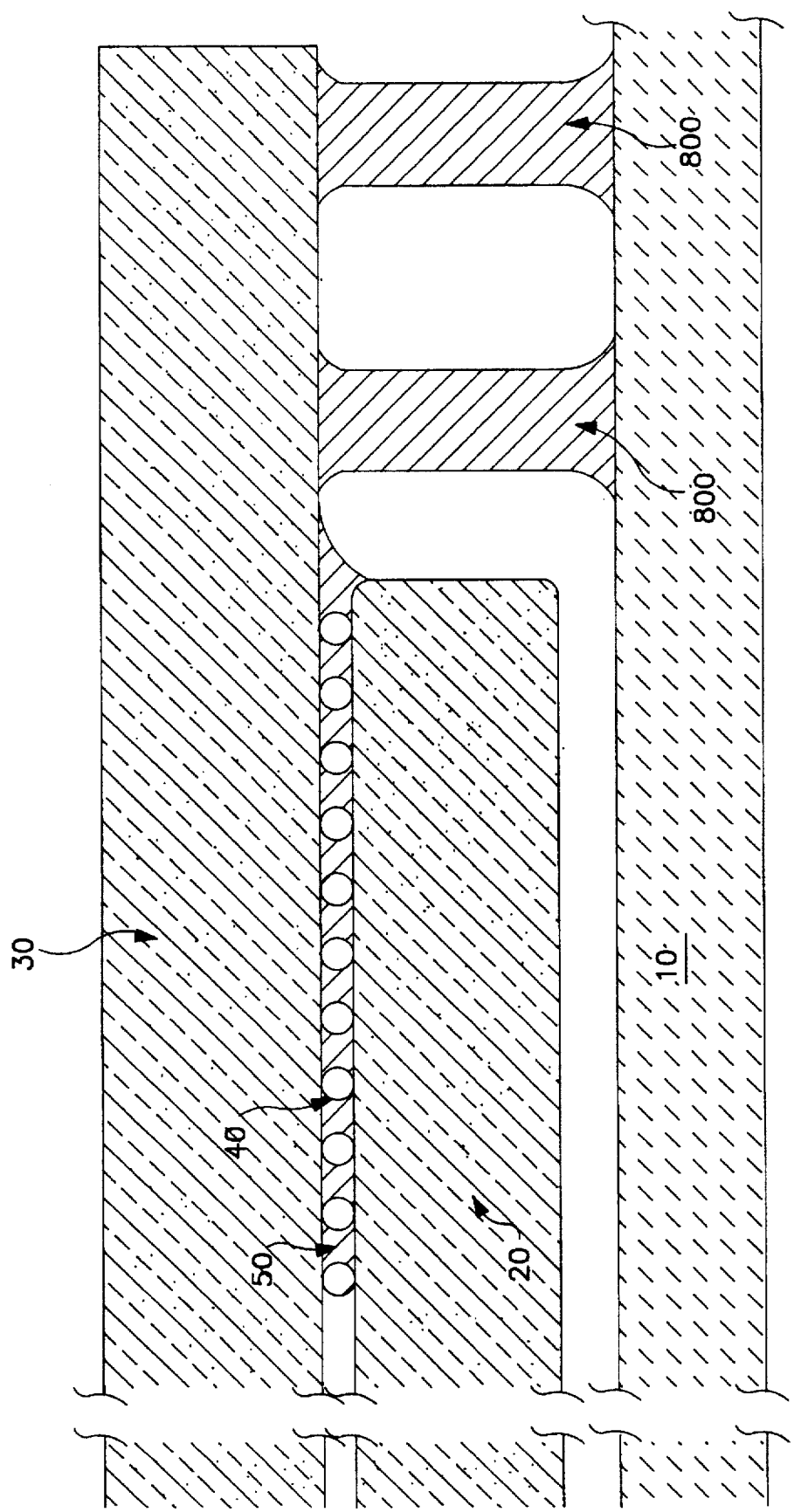
FIG. 8 is an enlarged cross sectional view of the chip package 100 shown in FIG. 1 according to another exemplary embodiment of the present invention.

FIG. 8 is another exemplary embodiment for mounting the chip package 100 on the interconnection substrate 10 except that the interposers 60, shown in FIGS. 1 and 2, have been replaced with columns 800 which may be formed by casting. The columns 800 are metal. The columns 800 are formed between the memory die 30 and the interconnection substrate 10 by casting or by casting wires in place on the memory die 30 and then subsequently the die and column assembly are joined to the interconnection substrate 10. The columns 800 are flexible. As a result, the cast columns 800 compensate for variations in the rates of expansion between the chip package 100 and the interconnection substrate 10.

Figure 9:
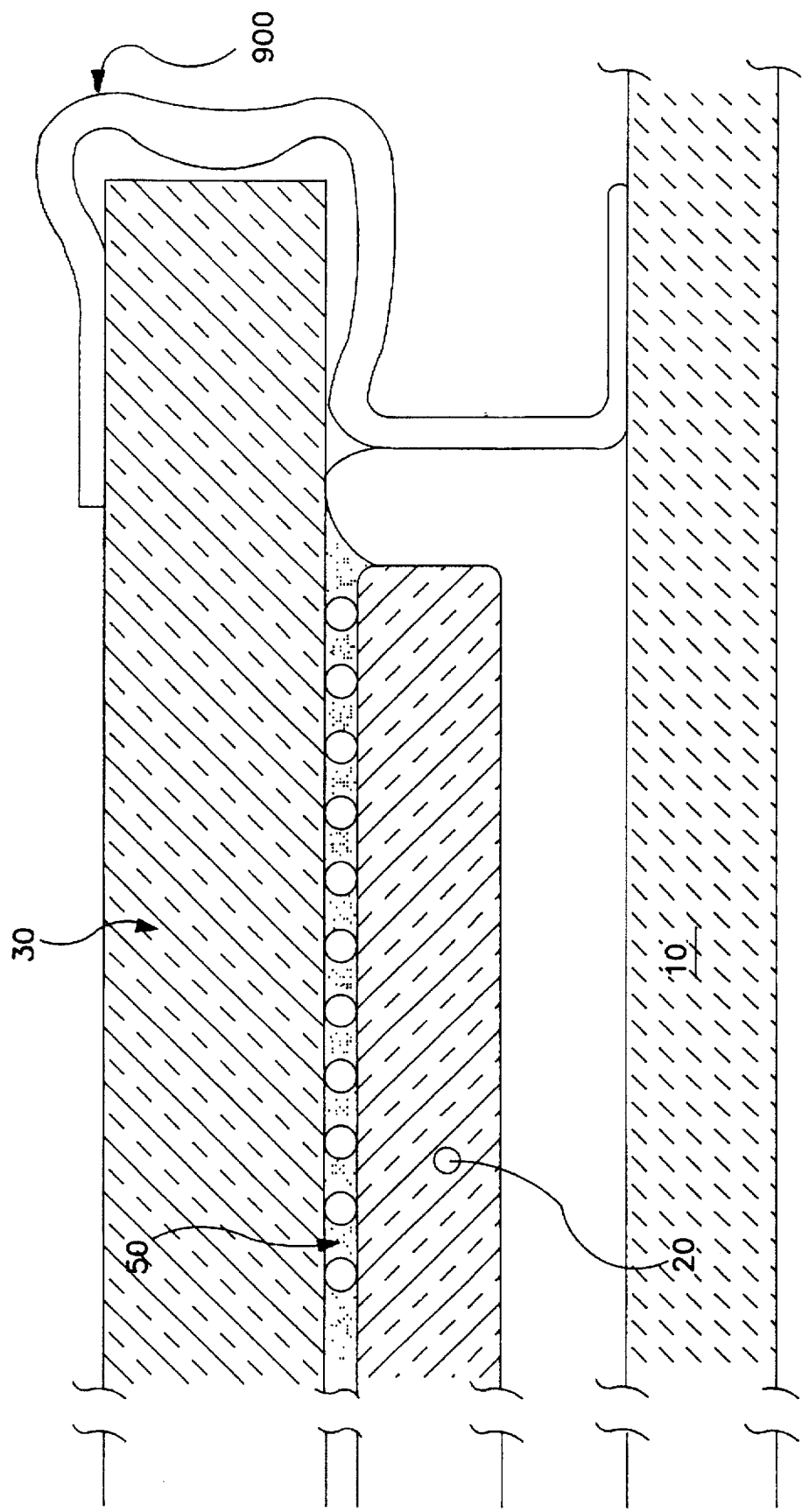
FIG. 9 is an enlarged cross sectional view of the chip package 100 shown in FIG. 1 according to a further exemplary embodiment of the present invention.

FIG. 9 is a further exemplary embodiment for mounting the chip package 100 on the interconnection substrate 10 except that the interposers 60, shown in FIGS. 1 and 2, have been replaced with clips 900. The clips 900 may be pre-soldered. The clips 900 are coupled to the chip package 100 and the solder is reflowed to form an electrical connection between the clips 900 and the memory die 30, and the clips 900 and the interconnection substrate 10. The clips 900 are flexible. As a result, the clips 900 compensate for variations in the rates of expansion between the chip package 100 and the interconnection substrate 10.

Figure 5:
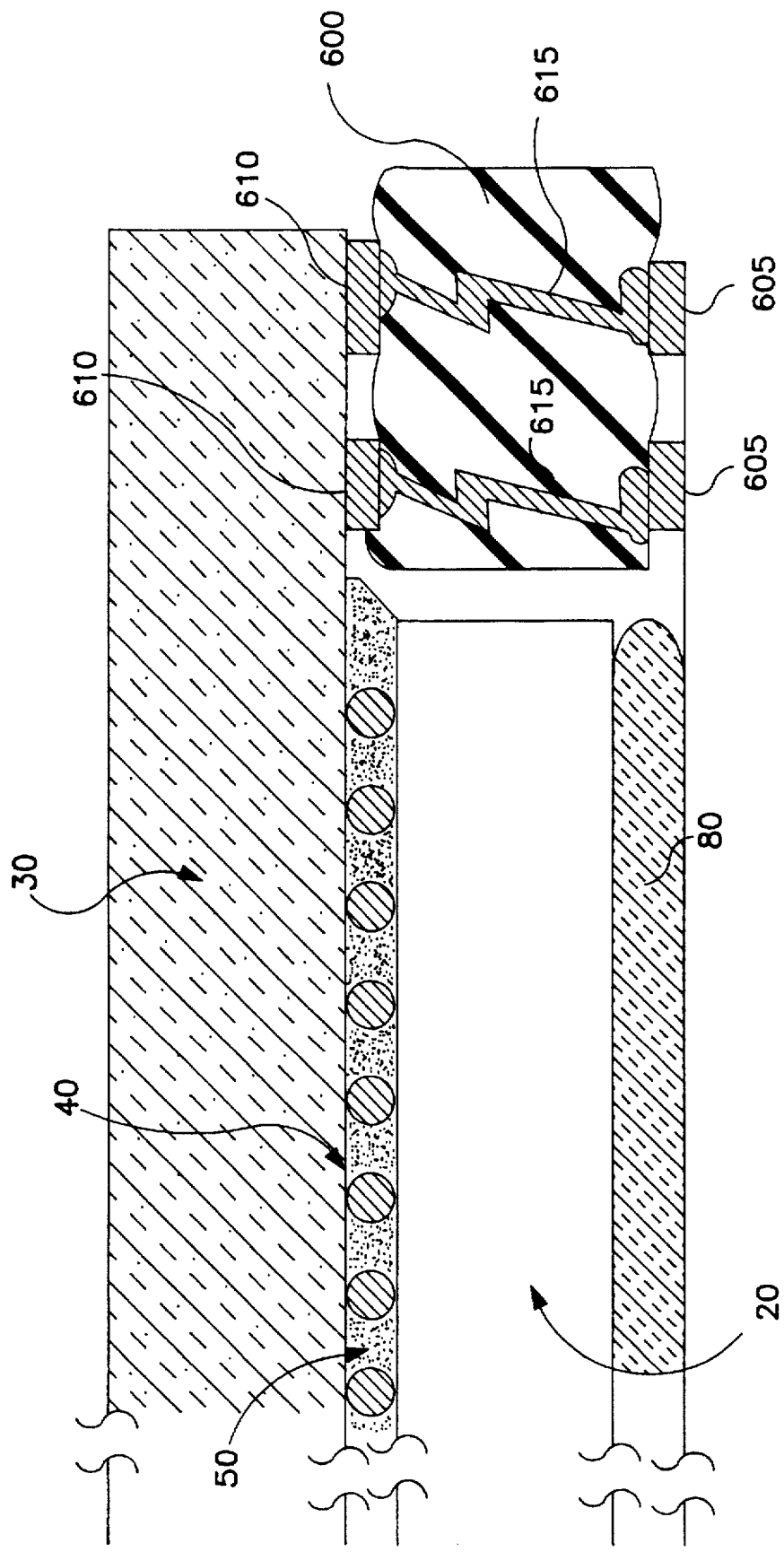
FIG. 5 is an enlarged cross sectional view of the chip package 100 shown in FIG. 1 according to another exemplary embodiment of the present invention.

FIG. 5 is another exemplary embodiment for mounting the chip package 100 on the interconnection substrate 10 except that the interposers 60, shown in FIGS. 1 and 2, have been replaced with elastomeric connectors 600. The elastomeric connectors 600 include conductors 615 formed in an elastomeric material. The conductors 615 are coupled to contacts 610 formed on the memory die 30 and to the interconnection substrate 10 via contacts 605. The elastomeric connectors 600 provide increased flexibility between the interconnection substrate 10 and the chip package 100 compensating for variations between the thermal coefficient of expansion between the interconnection substrate 10 and the chip package 100.

Figure 10:
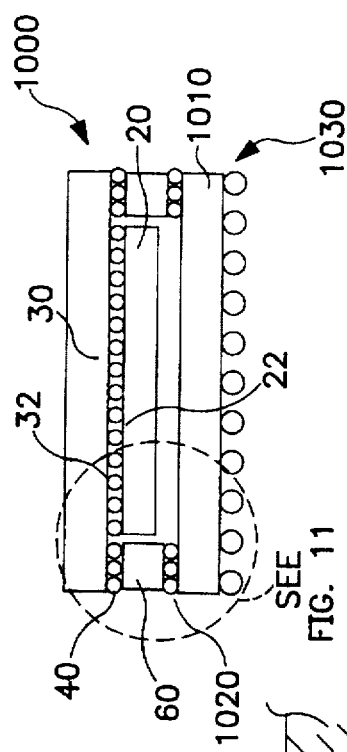
FIG. 10 is a cross sectional view of the chip package according to another exemplary embodiment of the present invention.
Figure 11:
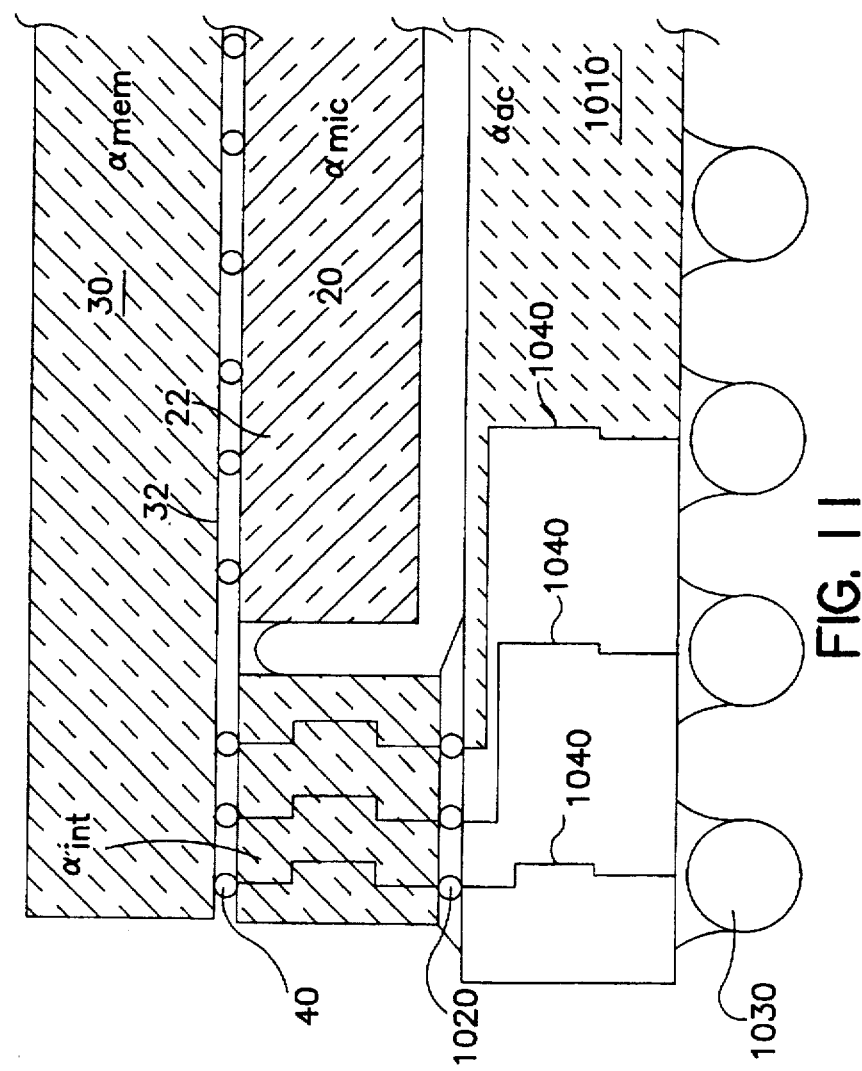
FIG. 11 is an enlarged cross sectional view of the chip package shown in FIG. 10.

FIG. 10 is a cross sectional view of the chip package 1000 according to another exemplary embodiment of the present invention. FIG. 11 is an enlarged cross sectional view of the chip package shown in FIG. 10. The chip package 1000 is the same as the chip package 100 shown in FIGS. 1 and 2 except that an area connector 1010 is coupled to the interposers 60 via BGA 1020. The BGA 1020 may be, for example, a micro BGA. The interposers 60 may be replaced with elastomeric connectors 600, shown in FIG. 5, columns 800, shown in FIG. 8, or clips 900, shown in FIG. 9.

Figure 12:
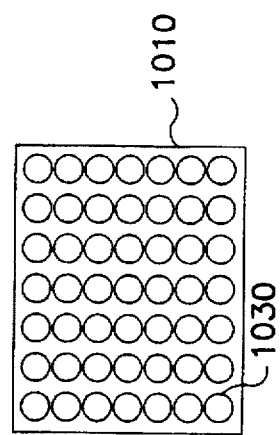
FIG. 12 is a top view of the chip package shown in FIG. 10.

The area connector 1010 may be fabricated from a material that has the same or substantially the same thermal coefficient of expansion as the microprocessor die 20, the memory die 30, and the interposer 60 ($\alpha_{ac} \approx \alpha_{mem} \approx \alpha_{mic} \approx \alpha_{int}$). The area connector 1010 routes the electrical signals provided via the BGA 1020 to BGA 1030, shown in FIG. 12, via signal lines 1040 formed in the area connector 1010. FIG. 12 is a top view of the area connector illustrating the BGA 1030. As a result, an increased number of interconnections may be formed between the chip package 1000 and the interconnection substrate 10 while minimizing the area the chip package 1000 occupies on the interconnection substrate 10.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. For example, the chip packages described above may be used to bond dies other than memory dies and microprocessor dies.

What is claimed is:

1. A chip package comprising:
   a first die having a first size and including wiring coupled to chip package primary input/output (I/O) interconnections; and
   a second die coupled directly to the first die and having a second size smaller than the first size, the second die providing and receiving signals via the first die to and from the chip package primary I/O interconnections.

2. The chip package according to claim 1, further comprising an interposer coupled to the chip package primary I/O.

3. The chip package according to claim 2, wherein the interposer is formed in segments.

4. The chip package according to claim 2, wherein the first die has a first thermal coefficient of expansion, the second die has a second thermal coefficient of expansion, and the interposer has a third thermal coefficient of expansion and wherein the first, second, and third thermal coefficients of expansion are substantially the same.

5. The chip package according to claim 1, wherein the first die has a first thermal coefficient of expansion and the second die has a second thermal coefficient of expansion that is substantially the same as the first thermal coefficient of expansion.

6. The chip package according to claim 1, further comprising a clip coupled to the chip package primary I/O interconnections.

7. The chip package according to claim 1, further comprising a column coupled to the chip package primary I/O interconnections.

8. The chip package according to claim 1, further comprising a wire bond coupled to the chip package primary I/O interconnections.

9. The chip package according to claim 1, further comprising an elastomeric connector coupled to the chip package primary I/O.

10. The chip package according to claim 1, further comprising an adhesive formed between the second die and the substrate.

11. The chip package according to claim 1, further comprising an area array connector for electrically coupling the first die to the second die.

12. The chip package according to claim 1, wherein the second die includes a first circuit, a second circuit, and internal wiring coupling the first circuit and the second circuit where a segment of the internal wiring is formed on the first die.

13. The chip package according to claim 1, further comprising a third die having a third size smaller than the first size, the third die providing and receiving further external signals to and from the substrate via the escape wiring.

14. The chip package according to claim 1, wherein the first die includes a first circuit and the second die includes a second circuit electrically coupled to the first circuit.

15. The chip package according to claim 1, wherein the first die is a memory and the second die is a microprocessor.

16. The chip package according to claim 1, wherein the second die is a memory and the first die is a microprocessor.

17. The chip package according to claim 16, wherein the second die includes a memory controller for controlling access to the memory for the first die.

18. The chip package according to claim 1, wherein the first die includes a first active surface and the second die includes a second active surface where the first active surface faces the second active surface.

19. The chip package according to claim 18, further comprising an area array connector formed between the first active surface and the second active surface.

20. The chip package according to claim 1, wherein the second die is formed above the substrate and the first die is formed above the second die.

21. The chip package according to claim 1, further comprising an area connector coupled to the first die.

22. A chip package comprising:
    a substrate having interconnections;
    a first die having a first size and a first thermal coefficient of expansion, the first die including escape wiring coupled to the interconnections;
    coupling means for coupling the first die to the substrate; and
    a second die coupled directly to the first die having a second size smaller than the first size and a second thermal coefficient of expansion that is substantially the same as the first thermal coefficient of expansion, the second die providing and receiving external signals to and from the substrate via the escape wiring.

23. The chip package according to claim 22, further comprising a third die having a third size smaller than the first size, the third die providing and receiving further external signals to and from the substrate via the escape wiring.

24. The chip package according to claim 22, wherein the first die includes internal wiring and the second die provides and receives internal signals to and from the second die via the internal wiring.

25. The chip package according to claim 22, wherein the first die is a memory and the second die is a microprocessor.

26. The chip package according to claim 22, wherein the second die is a memory and the first die is a microprocessor.

27. The chip package according to claim 22, wherein the first die includes a first active surface and the second die includes a second active surface where the first active surface faces the second active surface.

28. The chip package according to claim 27, further comprising an area array connector formed between the first active surface and the second active surface.

* * * * *